United States Patent [19]
Tajima

[11] Patent Number: 6,037,666
[45] Date of Patent: Mar. 14, 2000

[54] SEMICONDUCTOR INTEGRATED CIRCUIT HAVING STANDARD AND CUSTOM CIRCUIT REGIONS

[75] Inventor: Kazuhisa Tajima, Kumamoto, Japan

[73] Assignee: NEC Corporation, Tokyo, Japan

[21] Appl. No.: 08/968,298

[22] Filed: Nov. 12, 1997

[30] Foreign Application Priority Data

Nov. 12, 1996 [JP] Japan ................................. 8-300101

[51] Int. Cl.⁷ ................................................. H01L 23/48
[52] U.S. Cl. ........................ 257/777; 257/737; 257/797
[58] Field of Search ............................ 257/737, 777, 257/797

[56] References Cited

U.S. PATENT DOCUMENTS

| | | | |
|---|---|---|---|
| 4,818,728 | 4/1989 | Rai et al. | 437/209 |
| 4,871,921 | 10/1989 | Gurnee | 250/578 |
| 5,196,726 | 3/1993 | Nishiguchi et al. | 257/737 |
| 5,432,708 | 7/1995 | Mohsen | 364/490 |
| 5,477,067 | 12/1995 | Isomura et al. | |
| 5,541,814 | 7/1996 | Janai et al. | 361/778 |
| 5,770,995 | 6/1998 | Kamiya | 338/118 |

FOREIGN PATENT DOCUMENTS

| | | |
|---|---|---|
| 0 304 263 | 2/1989 | European Pat. Off. . |
| 0 348 972 | 1/1990 | European Pat. Off. . |
| 0 490 125 | 6/1992 | European Pat. Off. . |
| 0 740 343 | 10/1996 | European Pat. Off. . |
| 62-131554 | 6/1987 | Japan . |

*Primary Examiner*—Olik Chaudhuri
*Assistant Examiner*—Douglas A. Wille
*Attorney, Agent, or Firm*—Young & Thompson

[57] ABSTRACT

A semiconductor device includes a mother chip having a standard integrated circuit and electrodes pads, and an option chip having a custom integrated circuit, the option chip being provided over a part of the mother chip via connectors.

3 Claims, 6 Drawing Sheets

SEMICONDUCTOR INTEGRATED CIRCUIT HAVING STANDARD AND CUSTOM CIRCUIT REGIONS

BACKGROUND OF THE INVENTION

The present invention relates to a semiconductor integrated circuit, and more particularly to a semiconductor integrated circuit having both a standard circuit region and a custom circuit region which is customized for the user's requirement.

DESCRIPTION OF THE RELATED ART

The semiconductor integrated circuit integrated on a single chip often have both a standard circuit region and a custom circuit region which is customized for the user's requirement. The standard circuit region has basic and fundamental circuits which are standardized for common and basic purposes and functions. By contrast, the custom circuit region has modified and additional circuits which are customized for different and specific purposes and functions. In recent years, the majority of the semiconductor integrated circuits is the type as described above.

One of the conventional semiconductor integrated circuit having both standard and custom circuit regions will be described with reference to FIG. 1 which is a plane view illustrative of a conventional semiconductor integrated circuit chip having both standard and custom circuit regions. A semiconductor integrated circuit chip 10 has a peripheral region on which a plurality of electrode pads 12 are provided along each side of the semiconductor integrated circuit chip 10 A standard circuit region is provided which is surrounded by the peripheral region. The standard circuit region has basic/common circuits 11a which are standardized for basic and common purposes and functions. A custom circuit region is partially provided. The custom circuit region has custom circuits 20 which are customized for modification to the specification, modification to the function, and addition of the function for different and specific purposes and functions. The basic/common circuits 11a and the custom circuits 20 are connected via the electrode pads 12 to external circuits which are not illustrated.

In is very important to shorten the time of manufacturing the semiconductor integrated circuits having the standard and custom circuit regions. In order to shorten the manufacturing time, the standard circuit 11a has previously been formed before the custom circuit 20 is formed in accordance with various user's orders and requirements. Namely, the standard circuit 11a has previously been formed prior to the user's orders, whilst the custom circuit 20 is formed after receipt of the user's orders. Since the custom circuit 20 shares a small area in the semiconductor integrated circuit chip 10, a manufacturing time for manufacturing the custom circuit 20 may relatively be shortened. A time-period from receipt of the user's order to the delivery of the product is substantially defined by the manufacturing time for manufacturing the custom circuit 20. This means that it is possible to shorten the time-period from receipt of the user's order to the delivery of the product. It is also possible to shorten the total time for manufacturing the semiconductor integrated circuit chip 10.

As described above, the basic/common circuits 11a on the standard circuit region and the custom circuits 20 on the custom circuit region are prepared sequentially. Namely, it is impossible to simultaneously form the basic/common circuits 11a on the standard circuit region and the custom circuits 20 on the custom circuit region. It is limited in ability to shorten the time for manufacturing of the product. The above conventional type of the semiconductor integrated circuit having the standard and custom circuit regions does not allow further shortening of the manufacturing time.

If the custom circuit region is large relative to the standard circuit region, then it is difficult to obtain a substantive effect of the above shortening of the time-period from receipt of the user's order to the delivery of the product. For those reasons, it is required that the custom circuit region be small relative to the standard circuit region. This, however, substantially limits the responsibility and freedom to the customization.

In Japanese laid-open patent publication No. 4-199742, it is disclosed that a custom semiconductor integrated circuit is responsible for the requirement of shortening the development time-period and also the requirement of producing a small number of various types of the products. This custom semiconductor integrated circuit will be described with reference to FIGS. 2A and 2B. FIG. 2A is a plane view illustrative of a plurality of the conventional custom integrated circuit chips integrated on a single module substrate. FIG. 2B is a partially enlarged cross sectional elevation view illustrative of connections between a custom integrated circuit chip and a module substrate via bumps in an A-region in FIG. 2A.

A module substrate 30 has a peripheral region on which outside electrode pads 31 are provided along each side of the square-shaped module substrate 30. A plurality of the conventional custom integrated circuit chips 40 are provided on the module substrate 30 so that the plurality of the conventional custom integrated circuit chips 40 are surrounded by the peripheral region of the module substrate 30. Each of the custom integrated circuit chips 40 is connected via wirings to the outside electrode pads 31 on the module substrate 30. The module substrate 30 has interconnections which are customizable by routing desired wirings and interconnections as well as providing connections between the custom integrated circuit chips 40 and the electrode pads 31 in accordance with the user's requirements. For those purposes, the module substrate 30 has multi-level interconnection layers, each of which has a plurality of interconnections in parallel to each other, but the adjacent two layers are different in direction of interconnections by the right angle from each other, thereby to form programmable circuits. The programmable circuits are programmed in accordance with the user's requirements to obtain desired routines of interconnections between the multi-level interconnection layers and electrical connections between the interconnections and the electrode pads. Namely, the custom integrated circuit chips 40 are determined in accordance with the user's requirements, and then the desired routines of interconnections between the multi-level interconnection layers and electrical connections between the interconnections and the outside and inside electrode pads are determined in accordance with the custom integrated circuit chips 40. It is also possible to carry out parallel designs and parallel production of the custom integrated circuit chips 40 simultaneously. This makes it possible to shorten the time of the development of the product and manufacturing time thereof, even if it is required to produce a small number of various type custom integrated circuit chips 40.

As described above, the module substrate 30 has the programmable circuits which are programmed in accordance with the custom integrated circuit chips 40. This makes it possible to shorten the time-period of the development of the integrated circuit and also makes the circuits responsible for the requirements for producing small numbers of various types of the semiconductor integrated circuits. However, the module substrate 30 must have the redundancy of the multi-layered interconnections for obtaining the responsibility to the various types of the custom integrated circuit chips in accordance with the user's requirements, for which reason the size of the module substrate 30 is likely to be enlarged.

The module substrate 30 has only the programmable circuits which are programmed to provide interconnections between a plurality of the custom integrated circuit chips 40 and between the custom integrated circuit chips 40 and the electrode pads 31. On the other hand, the custom integrated circuit chips 40 have integrated circuits. Namely, the integrated circuits and the interconnections are formed in different substrates or chips. This results in enlargement in total size of the product and also makes it difficult to increase the density of integration of the circuits.

If a further scale down of the integrated circuits is required and a pitch of the electrode pads is further narrowed, then it is required to increase the accuracy in alignment between the electrode pads 31 on the module substrate 30 and the electrode pads 41 on tile custom integrated circuit chips 40. Since there had been no available measure for the alignment between the electrode pads 31 on the module substrate 30 and the electrode pads 41 on the custom integrated circuit chips 40, the connection error may appear between the electrode pads 31 and the electrode pads 41 or any unintended short circuit may be formed between the electrode pads.

Since the custom integrated circuit chips 40 are mounted on the module substrate 30 only via the electrode pads 31 and 41 and the bumps 42, the custom integrated circuit chips 40 are likely to be broken by an applied mechanical stress.

In the above circumstances, it had bee required to develop a novel semiconductor integrated circuit free from the above problems.

SUMMARY OF THE INVENTION

Accordingly, it is an object of the present invention to provide a novel semiconductor integrated circuit having standard and custom circuit regions, which is free from the above problems.

It is a further object of the present invention to provide a novel semiconductor integrated circuit having standard and custom circuit regions, which allows a remarkable scaling down thereof.

It is a still further object of the present invention to provide a novel semiconductor integrated circuit having standard and custom circuit regions, which allows a remarkable increase in the density of integration.

It is yet a further object of the present invention to provide a novel semiconductor integrated circuit having standard and custom circuit regions, which allows shortening a manufacturing time of the circuit.

It is a further more object of the present invention to provide a novel semiconductor integrated circuit having standard and custom circuit regions, which allows the increase in degree of customization.

It is moreover object of the present invention to provide a novel semiconductor integrated circuit having standard and custom circuit regions, which allows the increase in responsibility to the various user's requirements.

It is still more object of the present invention to provide a novel semiconductor integrated circuit having standard and custom circuit regions, which allows a highly accurate alignment between chips for enabling a substantive scaling down of the integrated circuits.

It is another object of the present invention to provide a novel semiconductor integrated circuit having standard and custom circuit regions, which is free from connection error and formation of short circuit between electrode pads.

It is still another object of the present invention to provide a novel semiconductor integrated circuit having standard and custom circuit regions, which is free from damage from an applied mechanical stress.

The above and other objects, features and advantages of the present invention will be apparent from the following descriptions.

The present invention provides a semiconductor device comprising a mother chip having a standard integrated circuit and electrodes pads, and at least an option chip having a custom integrated circuit, the option chip being provided over a part of the mother chip via connectors.

BRIEF DESCRIPTION OF THE DRAWINGS

Preferred embodiments according to the present invention will be described in detail with reference to the accompanying drawings.

DISCLOSURE OF THE INVENTION

The present invention provides a semiconductor device comprising a mother chip having a standard integrated circuit and electrodes pads, and at least an option chip having a custom integrated circuit, the option chip being provided over a part of the mother chip via connectors. A plurality of the option chips may be provided over the mother chip. The option chips may be the same type having the same custom circuit. The option chips may be different types having different custom circuits. It is also possible to further provide a connection switching circuit in the vicinity of the option chip for optionally providing connections enabling signals to be transmitted between the standard circuit in the mother chip and the custom circuit in the option chip. The connectors may comprise a plurality of first bump electrodes provided on the mother chip and a plurality of second bump electrodes provided on the option chip so that corresponding first and second bump electrodes making a pair are contact with each other to electrically and mechanically bond the option chip to the mother chip. It is further possible to further provide at least a protection and buffer layer between the mother chip and the option chip for buffering the mother chip and the option chip from an applied mechanical stress and also the at least protection and buffer layer being positioned between adjacent pairs of the corresponding first and second bump electrodes for isolate the adjacent pairs of the corresponding first and second bump electrodes. It is further possible to further provide at least a first short caliper portion on the mother chip and at least a second short caliper portion provided on the option chip, wherein the first short caliper portion has at least a first alignment terminal whilst the second short caliper portion has at least a second alignment terminal corresponding to the first alignment terminal, so that the first and second alignment terminals are made into contact with each other only when the mother chip and the option chip are aligned correctly. It is further possible to further provide a sensor connected to any one of the first and second alignment terminals and a power source being connected through the sensor to the one of the first and second alignment terminals, wherein another of the first and second alignment terminals is connected to a ground line. The first alignment terminal may have a tapered top portion and the second alignment terminal has a hollowed top portion for receiving the tapered top portion so that the fist and second alignment terminals are engaged with each other via the tapered and hollowed top portions thereof. A plurality of the first alignment terminals with a first width are provided at a first pitch and a plurality of the second alignment terminals with a second width different from the first width are provided at a second pitch different from the first pitch.

PREFERRED EMBODIMENTS

Figure 1:
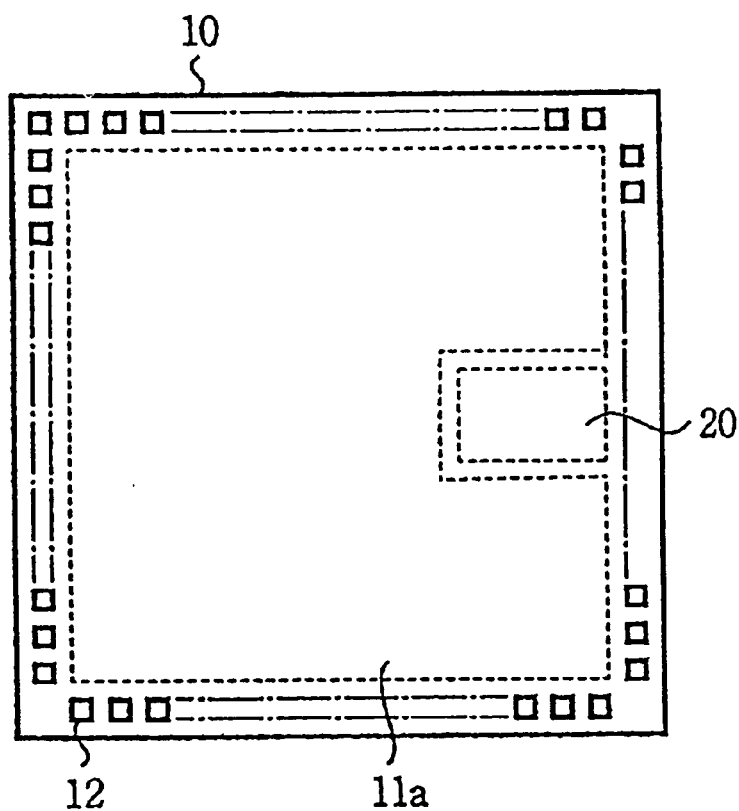
FIG. 1 is a plane view illustrative of a conventional semiconductor integrated circuit chip having both standard and custom circuit regions.
Figure 2A:
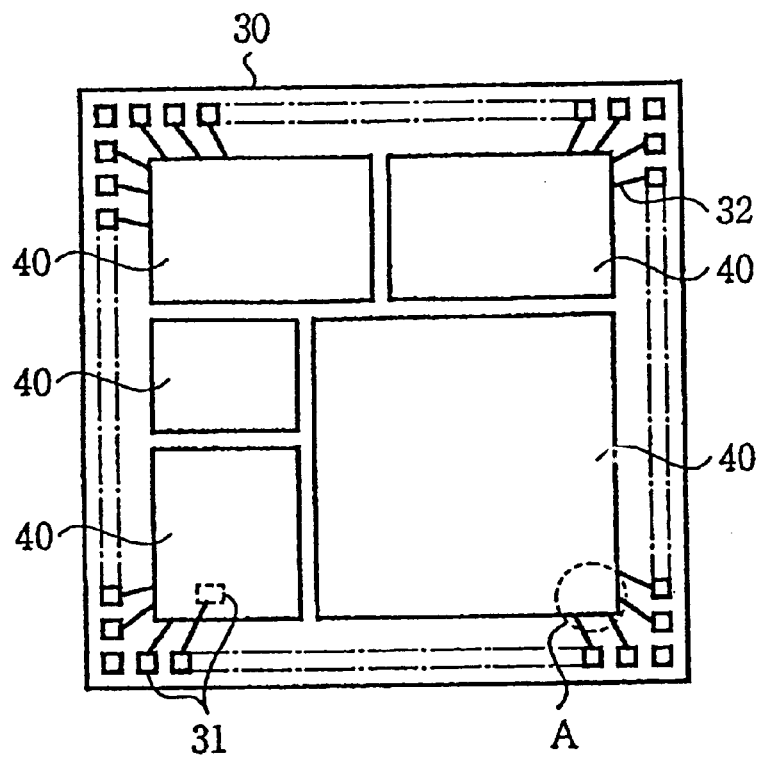
FIG. 2A is a plane view illustrative of a plurality of the conventional custom integrated circuit chips integrated on a single module substrate.
Figure 2B:
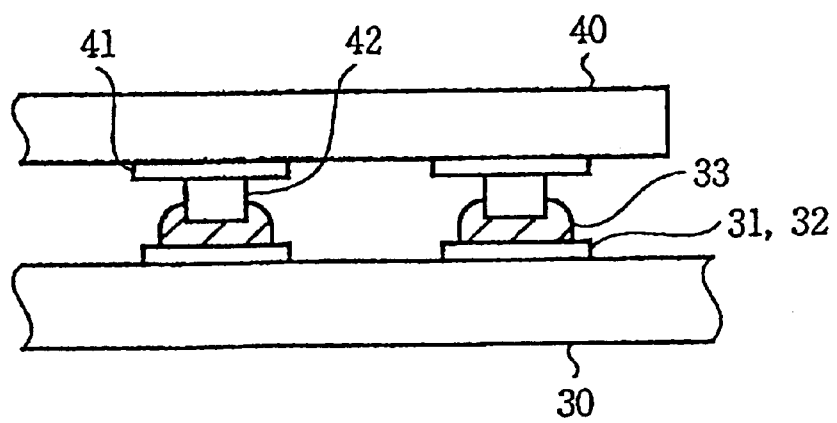
FIG. 2B is a partially enlarged cross sectional elevation view illustrative of connections between a custom integrated circuit chip and a module substrate via bumps in an A-region in FIG. 2A.
Figure 3A:
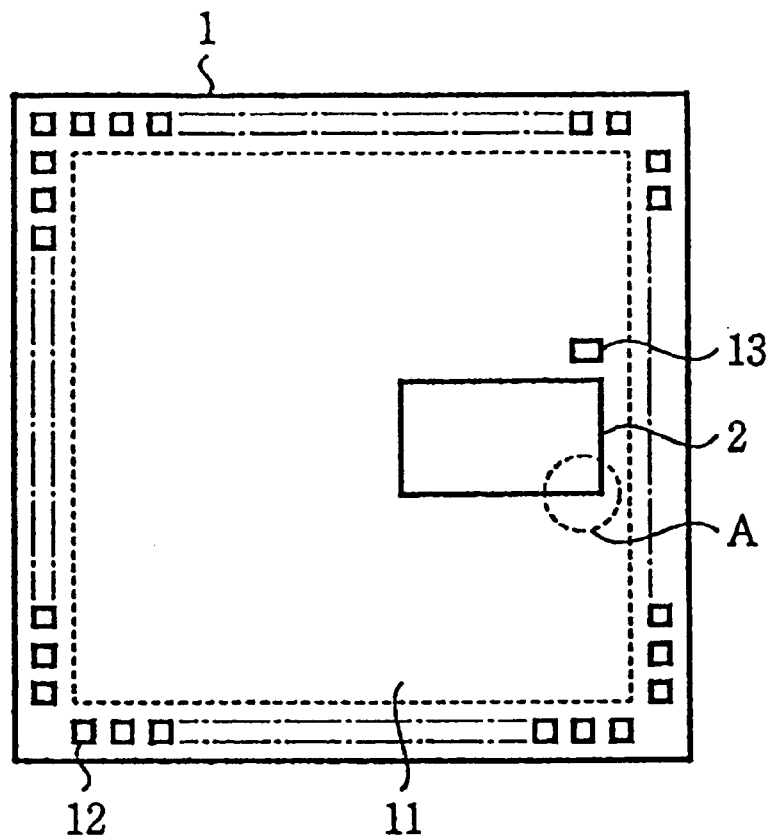
FIG. 3A is a plane view illustrative of a novel integrated circuit having standard and custom circuit regions in a first embodiment according to the present invention.
Figure 3B:
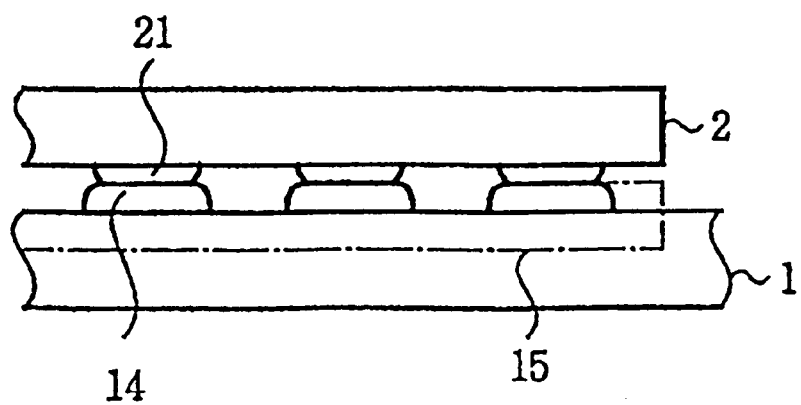
FIG. 3B is a partially enlarged cross sectional elevation view illustrative of connections between an option chip and a mother chip via bumps in an A-region in FIG. 3A.

First Embodiment:

A first embodiment according to the present invention will be described with reference to FIGS. 3A and 3B. FIG. 3A is a plane view illustrative of a novel integrated circuit having standard and custom circuit regions. FIG. 3B is a partially enlarged cross sectional elevation view illustrative of connections between an option chip and a mother chip via bumps in an A-region in FIG. 3A. A mother chip 1 has a peripheral region on which a plurality of electrode pads 12 are provided along each side of the mother chip 1. A standard circuit region is provided which is surrounded by the peripheral region. A custom circuit region is partially provided in the standard circuit region. The standard circuit region has basic/common circuits 11 which are standardized for basic and common purposes and functions. The custom circuit region has an option chip connection region 15. The option chip connection region 15 has a plurality of bump electrodes 14. An option chip 2 is mounted on the option chip connection region 15 in the custom circuit region. The option chip 2 has a plurality of bump electrodes 21 so that the option chip 2 is mounted via the bump electrodes 21 and 14 over the option chip connection region 15 in the custom circuit region. The option chip 2 has custom circuits which are customized for modification to the specification, modification to the function, and addition of the function for different and specific purposes and functions. The mother chip 1 has a connection switching circuit 13 in the vicinity of the option chip connection region 15. If the option chip 2 having the custom integrated circuits is mounted on the option chip connection region 15 in the mother chip 1, then the connection switching circuit 13 provides connections between the functions of the custom circuits of the option chip 2 and the functions of the mother chip 1. If, however, no option chip is mounted on the option chip connection region 15 in the mother chip 1, then the connection switching circuit 13 provides such connections that the mother chip 1 can perform the functions itself. The switching of the connections by the connection switching circuit 13 is made by cutting or non-cutting fuses.

The customization is often required to the same portion of the standard integrated circuits. Mostly, the modifications in specification and function and the addition of function are required to the predetermined portion of the standard integrated circuits to the predetermined signals. For those reasons, the kinds of signals for the modifications transmitted between the basic/common circuits 11 of the standard circuit region and the custom circuits in the option chip 2 are somewhat limited. It is, therefore, possible that the number of the bump electrodes 14 and 21 and the placements thereof are common to some types of the custom circuits, namely common to some types of the option chips 2.

The mother chip 1 is commonly useable to the some types of the option chips 2 and the connection switching circuit 13 makes it possible to confirm that the mother chip 1 shows the predetermined functions without the option chip 2. It is therefore possible to prepare the mother chip 1 and test the same before receipt of the user's order. The kinds of the option chip 2 are limited. This makes it possible to previously prepare all or some types of the option chips 2 in the different processes from the process for preparing the mother chip 1. The option chip 2 is selected in accordance with the user's needs. The selected option chip 2 is mounted on the mother chip 1 and then the connection switching circuit 13 is switched to provide connections between the mother chip 1 and the option chip 2 for enabling signals to be transmitted between the mother chip 1 and the option chip 2, whereby the integrated circuit is customized for the user's specific orders. All or some types of the mother chip 1 and all or some types of the option chip 2 may previously be prepared before receipt of the user's order, for which reason the time-period from receipt of the user's order to the delivery of the product is substantially defined by the time necessary for selecting the option chip 1 and subsequent switching of the connection switching circuit 13 to provide the connection between the mother chip 1 and the option chip 2 and testing the product. This allows a considerable shortening of the time-period from receipt of the user's order to the delivery of the product. If a new user's order is received, it is possible to prepare a new type option chip having a newly customized integrated circuit. In this cases, it is also possible to shorten the time-period from receipt of the user's order to the delivery of the product.

The size of the option chip 2 is not strictly limited. This allows widening the available variation of the customization of the option chip 2. The basic/common circuits 11 may be formed in the option chip connection region 15 in the mother chip 1 This may increase in the density of the integration much higher than the conventional ones. This also may reduce the size of the integrated circuit on the mother chip 1.

Figure 4A:
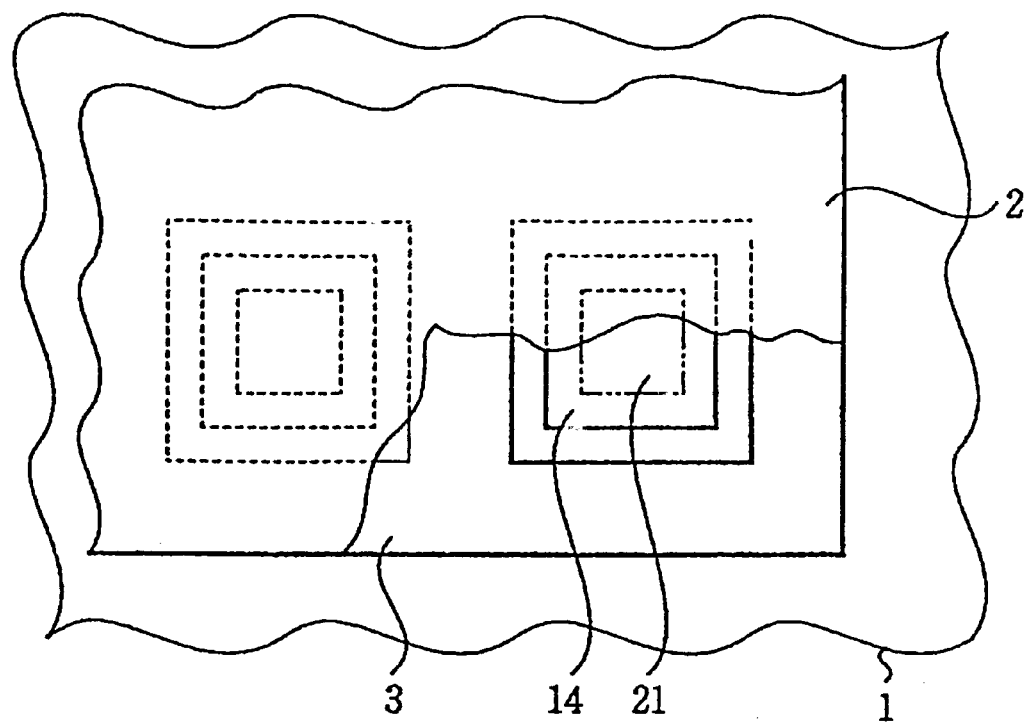
FIG. 4A is a plane view illustrative of option chips mounted on a mother chip in a second embodiment according to the present invention.
Figure 4B:
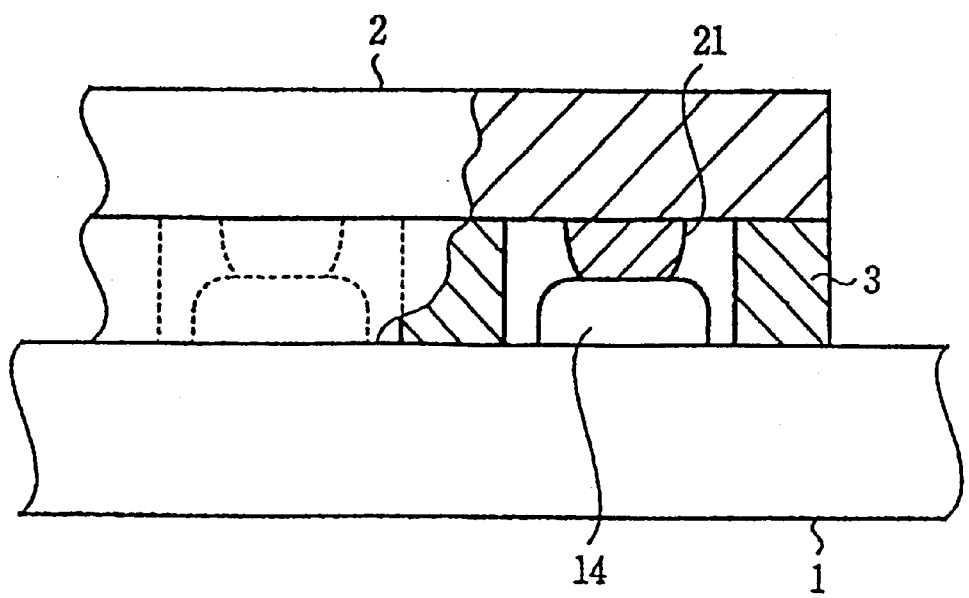
FIG. 4B is a fragmentary cross sectional elevation view illustrative of connections between an option chip and a mother chip via bumps in FIG. 4A.

Second Embodiment:

A second embodiment according to the present invention will be described with reference to FIGS. 4A and 4B. FIG. 4A is a plane view illustrative of option chips mounted on a mother chip. FIG. 4B is a fragmentary cross sectional elevation view illustrative of connections between an option chip and a mother chip via bumps in FIG. 4A. The structure of the semiconductor integrated circuit chip is substantially the same as in the first embodiment except for a protection buffer layer 3 being provided between the mother chip 1 and the option chip 2. A mother chip 1 has a peripheral region on which a plurality of electrode pads are provided along each side of the mother chip 1. A standard circuit region is provided which is surrounded by the peripheral region. A custom circuit region is partially provided in the standard circuit region. The standard circuit region has basic/common circuits which are standardized for basic and common purposes and functions. The custom circuit region has an option chip connection region. The option chip connection region has a plurality of bump electrodes 14. An option chip 2 is mounted on the option chip connection region in the custom circuit region. The option chip 2 has a plurality of bump electrodes 21 so that the option chip 2 is mounted via the bump electrodes 21 and 14 over the option chip connection region 15 in the custom circuit region. The option chip 2 has custom circuits which are customized for modification to the specification, modification to the function, and addition of the function for different and specific purposes and functions. The protection buffer layers 3 are provided between in spaces defined between the mother chip 1 and the option chip 2 and also between the adjacent pairs of the bump electrodes 14 and 21. Each of the protection and buffer layers 3 provides electrical isolations between the adjacent pairs of the bump electrodes 14 and 21 in order to prevent any formation of short circuits between the adjacent combinations of the bump electrodes 14 and 21. The protection and buffer layers 3 are also able to serve as buffer layer for buffering the option chip 2 and the mother chip 1 from applied mechanical stress or mechanical shock so as to prevent the option chip 2 and the mother chip 1 from receiving damage or being broken. The protection and buffer layer 3 may be provided on at least one of the mother chip 1 and the option chip 2. The protection and buffer layer 3 may comprise PGMA/PMMA resins of a polyimide resist with a low dielectric constant. The PGMA/PMMA resin may selectively be formed by photolithography. The mother chip 1 has a connection switching circuit in the vicinity of the option chip connection region.

In addition to the above effect provided by the protection and buffer layer 3, the same effects as in the first embodiment can be obtained.

Figure 5A:
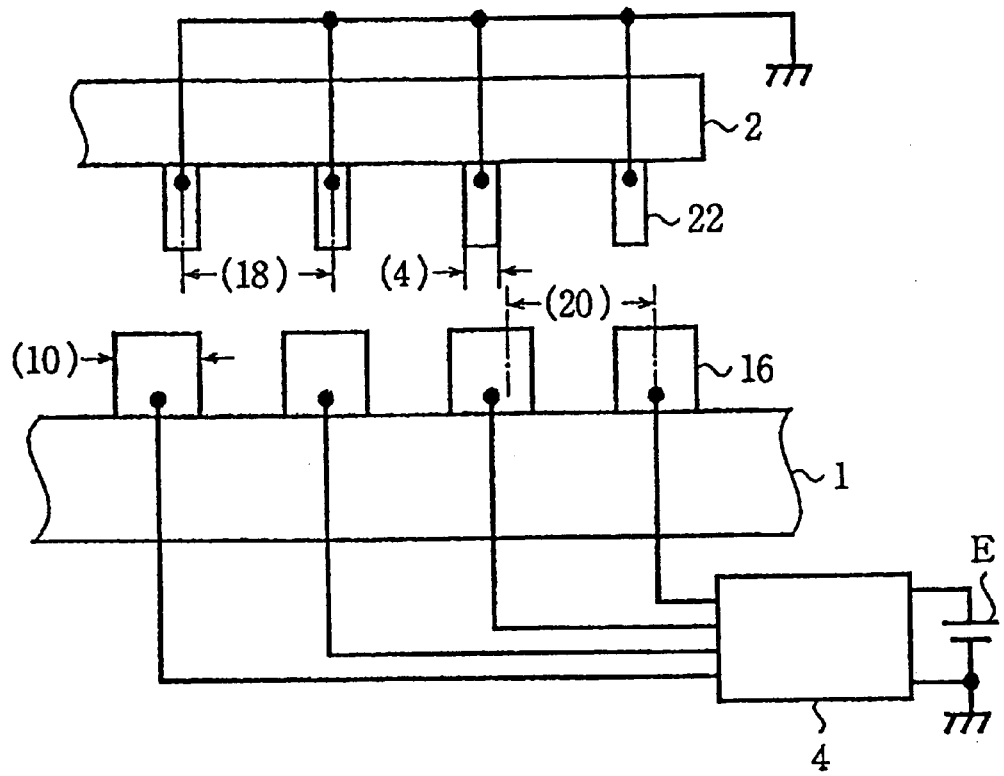
FIG. 5A is a schematic and fragmentary cross sectional elevation view illustrative of a short calipers alignment between an option chip and a mother chip in a third embodiment according to the present invention.
Figure 5B:
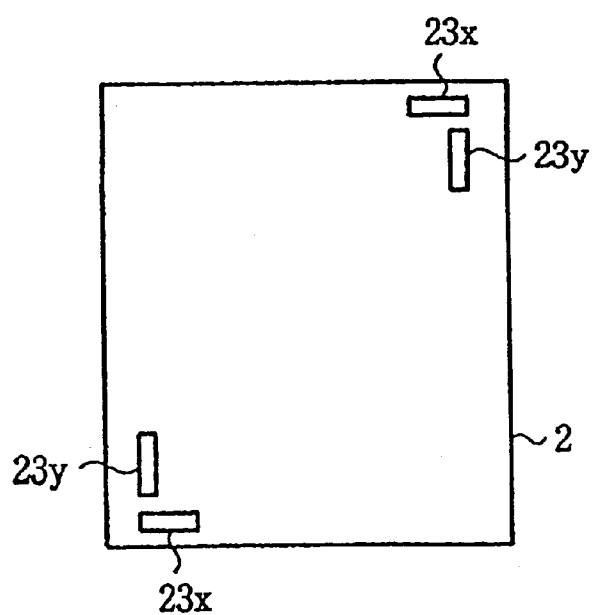
FIG. 5B is a plane view illustrative of short calipers provided in an option chip in a third embodiment according to the present invention.

Third Embodiment:

A third embodiment according to the present invention will be described with reference to FIGS. 5A and 5B. FIG. 5A is a schematic and fragmentary cross sectional elevation view illustrative of a short calipers alignment between an option chip and a mother chip. FIG. 5B is a plane view illustrative of short calipers provided in an option chip. As the scaling down of the integrated circuit chip is required, then it is also required to narrow the pitch of the bump electrodes 14 and 21. Under this condition, a highly accurate alignment between the mother chip 1 and the option chip 2 is required. Since further the distance between the mother chip 1 and the option chip 2 is narrow, then it is difficult to confirm that the corresponding pairs of the bump electrodes 14 and 21 are correctly positioned to be bonded to each other. For those reasons, it is effective to use the principle of the calipers. For example, as illustrated in FIG. 5A, a plurality of short caliper portions 23$x$ and 23$y$ are provided, so that a plurality of alignment terminals 16 with a constant width are provided on the mother chip 1 at a predetermined constant pitch whilst a plurality of alignment terminals 22 with a constant width are provided on the option chip 2 at a predetermined constant pitch. The predetermined constant pitch of the alignment terminals 22 is different from the predetermined constant pitch of the alignment terminals 16. The alignment terminals 22 is also different in width from the alignment terminals 16. The alignment terminals 16 are connected to a sensor 4 which is connected to a dc power source E. The alignment terminals 22 are connected to a ground line. The sensor 4 is used to confirm the conductivity between the corresponding alignment terminals 16 and 22 for confirmation of accurate mounting position of the option chip 2 onto the mother chip 1. If the conductivity could be confirmed to all of the paired alignment terminals 16 and 22, then the accurate position of the option chip 2 over the mother chip 1 is confirmed.

The height of the alignment terminals 16 and 22 is set slightly higher than the height of the bump electrodes 14 and 21 so that if the alignment terminals 16 and 22 softly contact with each other, then the bump electrodes 14 and 21 do not contact with each other whereby it is possible to confirm the conductivity of the individual pairs of the alignment terminals 16 and 22. After the conductivity of all pairs of the alignment terminals 16 and 22 is confirmed, then the alignment terminals 16 and 22 are made into hardly contact with each other so that the bump electrodes 14 and 21 are also made into contact with each other to bond the option chip 2 onto the mother chip 1 at highly accurate position.

Figure 6A:
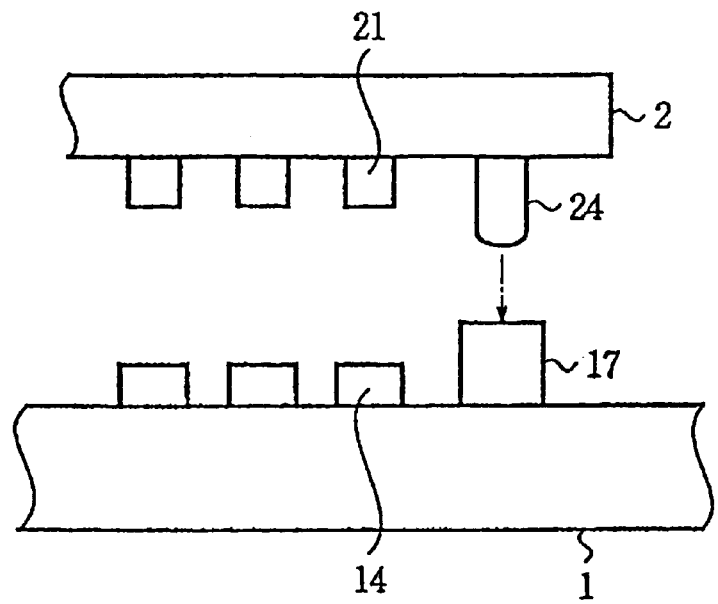
FIG. 6A is a schematic and fragmentary cross sectional elevation view illustrative of a self-alignment between an option chip and a mother chip in a fourth embodiment according to the present invention.
Figure 6B:
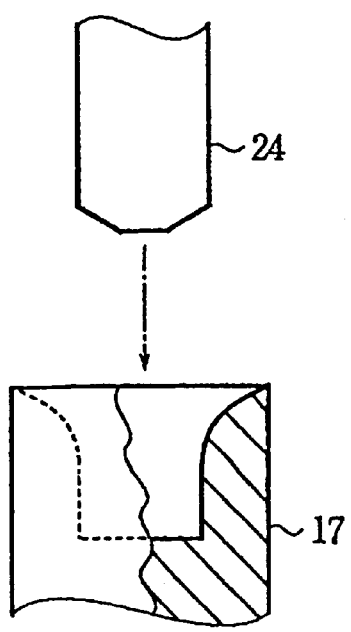
FIG. 6B is a view illustrative of a self-alignment terminal used for self-alignment between an option chip and a mother chip in a fourth embodiment according to the present invention.

Fourth Embodiment:

A fourth embodiment according to the present invention will be described with reference to FIGS. 6A and 6B. FIG. 6A is a schematic and fragmentary cross sectional elevation view illustrative of a self-alignment between an option chip and a mother chip. FIG. 6B is a view illustrative of a self-alignment terminal used for self-alignment between an option chip and a mother chip. As the scaling down of the integrated circuit chip is required, then it is also required to narrow the pitch of the bump electrodes 14 and 21. Under this condition, a highly accurate alignment between the mother chip 1 and the option chip 2 is required. Since further the distance between the mother chip 1 and the option chip 2 is narrow, then it is difficult to confirm that the corresponding pairs of the bump electrodes 14 and 21 are correctly positioned to be bonded to each other. For those reasons, it is effective to use the principle of the calipers. A plurality of short caliper portions are provided, so that an alignment terminal 17 with a constant width is provided on the mother chip 1 whilst an alignment terminal 24 with a constant width is provided on the option chip 2. The alignment terminal 17 is connected to a sensor 4 which is connected to a dc power source E. The alignment terminal 24 is connected to a ground line. The sensor 4 is used to confirm the conductivity between the corresponding alignment terminal 17 and 24 for confirmation of accurate mounting position of the option chip 2 onto the mother chip 1. If the conductivity could be confirmed to all of the paired alignment terminal 17 and 24, then the accurate position of the option chip 2 over the mother chip 1 is confirmed.

The height of the alignment terminals 17 and 24 is set higher than the height of the bump electrodes 14 and 21. The alignment terminal 24 has a tapered top portion whilst the alignment terminal 17 has a top portion with a hollow portion for receiving the tapered top portion of the alignment terminal 24. If the alignment terminals 17 and 24 are engaged with each other, then the accurate alignment between the mother chip 1 and the option chip 2 can easily be made. It is possible to confirm the conductivity of the individual pairs of the alignment terminals 17 and 24. After the conductivity of all pairs of the alignment terminals 17 and 24 is confirmed, then the alignment terminals 17 and 24 are made into hard contact with each other so that the bump electrodes 14 and 21 are also made into contact with each other to bond the option chip 2 onto the mother chip 1 at highly accurate position.

As modifications to the above embodiments, it is possible to use the above embodiments in combination. It is also possible to provide a plurality of option chips on a plurality of the option chip connection regions 15.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising:
    a mother chip having a standard integrated circuit and electrodes pads; and
    at least an option chip having a custom integrated circuit, the option chip being provided over a part of the mother chip via connectors, the connectors comprising a plurality of first bump electrodes provided on the mother chip and a plurality of second bump electrodes provided on the option chip so that corresponding first and second bump electrodes making a pair are contact with each other to electrically and mechanically bond the option chip to the mother chip, wherein a plurality of the first alignment terminals with a first width are provided at a first pitch and a plurality of the second alignment terminals with a second width different from the first width are provided at a second pitch different from the first pitch.

2. A semiconductor device comprising:
    a mother chip having a standard integrated circuit and electrodes pads; and
    at least an option chip having a custom integrated circuit, the option chip being provided over a part of the mother chip via connectors, a connection switching circuit being provided in the vicinity of the option chip for optionally providing connections enabling the signals to be transmitted between the standard circuit in the mother chip and the custom circuit in the option chip, further comprising at least a protection and buffer layer being provided between the mother chip and the option chip for buffering the mother chip and the option chip from an applied mechanical stress and also the at least protection and buffer layer being positioned between adjacent pairs of the corresponding first and second bump electrodes for isolate the adjacent pairs of the corresponding first and second bump electrodes,
    wherein the connectors comprise a plurality of first bump electrodes provided on the mother chip and a plurality of second bump electrodes provided on the option chip so that corresponding first and second bump electrodes making a pair are contact with each other to electrically and mechanically bond the option chip to the mother chip, and
    wherein a plurality of the first alignment terminals with a first width are provided at a first pitch and a plurality of the second alignment terminals with a second width different from the first width are provided at a second pitch different from the first pitch.

3. A semiconductor device comprising:
    a mother chip having a standard integrated circuit and electrodes pads; and
    at least an option chip having a custom integrated circuit, the option chip being provided over a part of the mother chip via connectors, the connectors comprising a plurality of first bump electrodes provided on the mother chip and a plurality of second bump electrodes provided on the option chip so that corresponding first and second bump electrodes making a pair are contact with each other to electrically and mechanically bond the option chip to the mother chip,
    further comprising at least a protection and buffer layer being provided between the mother chip and the option chip for buffering the mother chip and the option chip from an applied mechanical stress and also the at least protection and buffer layer being positioned between adjacent pairs of the corresponding first and second bump electrodes for isolate the adjacent pairs of the corresponding first and second bump electrodes, and
    further comprising at least a first short caliper portion provided on the mother chip and at least a second short caliper portion provided on the option chip, wherein the first short caliper portion has at least a first alignment terminal whilst the second short caliper portion has at least a second alignment terminal corresponding to the first alignment terminal, so that the first and second alignment terminals are made into contact with each other only when the mother chip and the option chip are aligned correctly, wherein a plurality of the first alignment terminals with a first width are provided at a first pitch and a plurality of the second alignment terminals with a second width different from the first width are provided at a second pitch different from the first pitch.

* * * * *